United States Patent
Morse

(10) Patent No.: US 11,908,669 B2
(45) Date of Patent: Feb. 20, 2024

(54) THERMALLY CONTROLLED MAGNETIC FIELDS OPTIMIZATION SYSTEM FOR SPUTTER DEPOSITION PROCESSES

(71) Applicant: Arizona Thin Film Research, LLC, Tucson, AZ (US)

(72) Inventor: Patrick Morse, Tucson, AZ (US)

(73) Assignee: Arizona Thin Film Research, LLC, Tucson, AZ (US)

( * ) Notice: Subject to any disclaimer, the term of this patent is extended or adjusted under 35 U.S.C. 154(b) by 12 days.

(21) Appl. No.: 17/570,747

(22) Filed: Jan. 7, 2022

(65) Prior Publication Data

US 2022/0223392 A1    Jul. 14, 2022

Related U.S. Application Data

(60) Provisional application No. 63/135,179, filed on Jan. 8, 2021.

(51) Int. Cl.
*H01J 37/34* (2006.01)
*H01F 7/02* (2006.01)
*C23C 14/35* (2006.01)

(52) U.S. Cl.
CPC .......... *H01J 37/3461* (2013.01); *C23C 14/35* (2013.01); *H01F 7/02* (2013.01); *H01J 2237/002* (2013.01); *H01J 2237/332* (2013.01)

(58) Field of Classification Search
CPC ............. H01J 37/3461; H01J 2237/002; H01J 2237/332; C23C 14/35; C23C 14/3407; H01F 7/02; H01F 7/0273
See application file for complete search history.

(56) References Cited

U.S. PATENT DOCUMENTS

| | | | | |
|---|---|---|---|---|
| 4,299,678 A | * | 11/1981 | Meckel | H01J 37/3408 204/192.15 |
| 4,500,408 A | * | 2/1985 | Boys | C23C 14/542 204/192.12 |
| 9,312,108 B2 | | 4/2016 | Crowley et al. | |
| 10,163,612 B2 | | 12/2018 | De Bosscher et al. | |
| 2002/0100680 A1 | * | 8/2002 | Yamamoto | H01J 37/3497 204/192.12 |
| 2007/0170052 A1 | * | 7/2007 | Ritchie | H01J 37/3408 204/298.12 |

FOREIGN PATENT DOCUMENTS

EP        1412964 B1    4/2004

* cited by examiner

*Primary Examiner* — Jennifer Wecker
*Assistant Examiner* — Patrick S Ott
(74) *Attorney, Agent, or Firm* — Law Offices of Damon L. Boyd, PLLC

(57) ABSTRACT

The present disclosure provides systems and methods of controlling a magnetically confined plasma sputtering process using the waste heat transferred from the plasma into the target material and then into thermally controlled magnetic field adjustment assemblies that modify the strength of the plasma confinement magnetic fields on the target material.

7 Claims, 14 Drawing Sheets

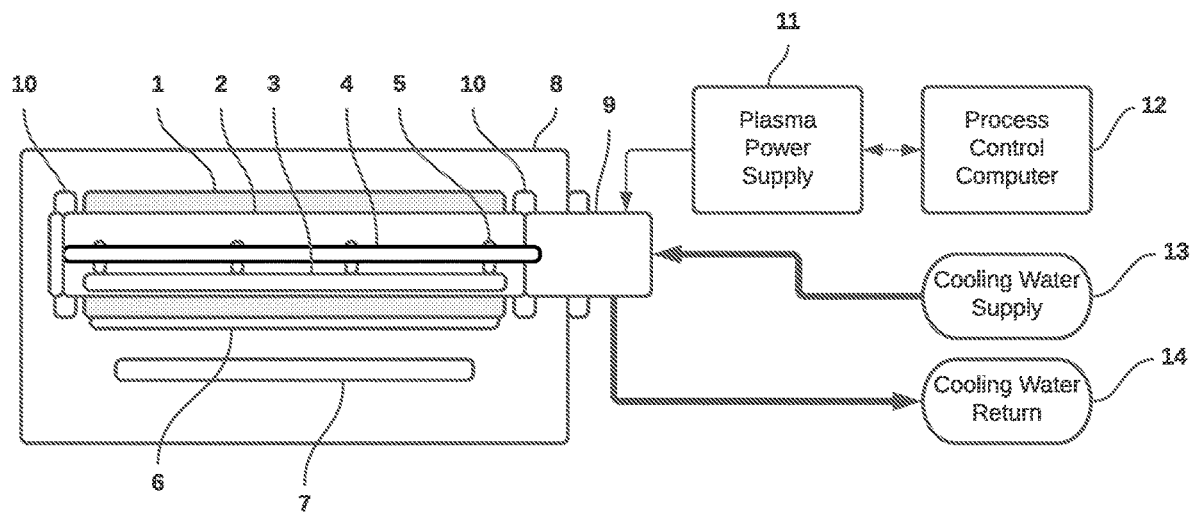
Figure 1 - Manual / Motorized Magnet Bar - Prior Art

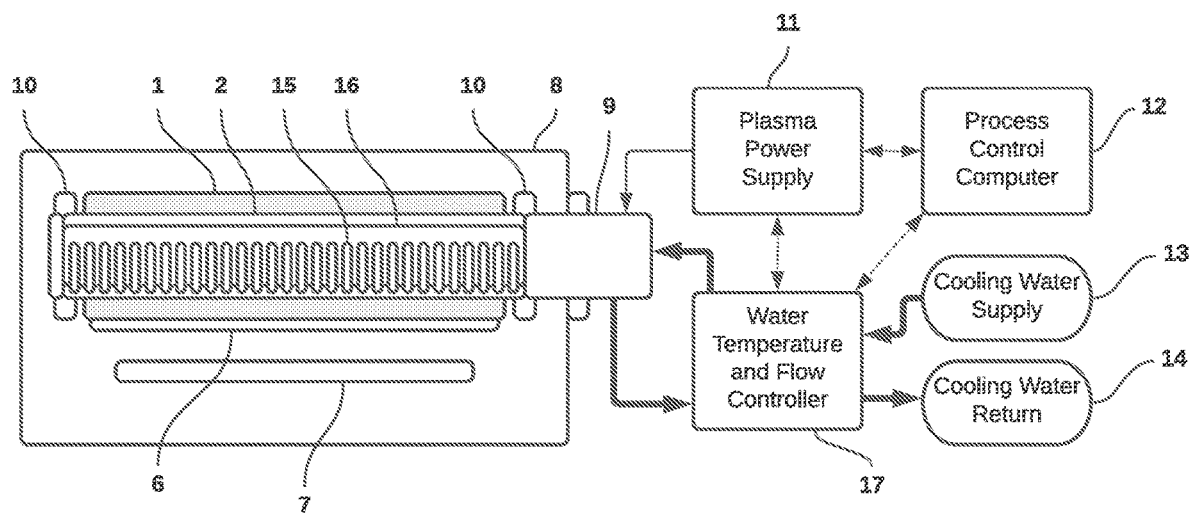
Figure 2 - Thermal Magnetic Adjusters

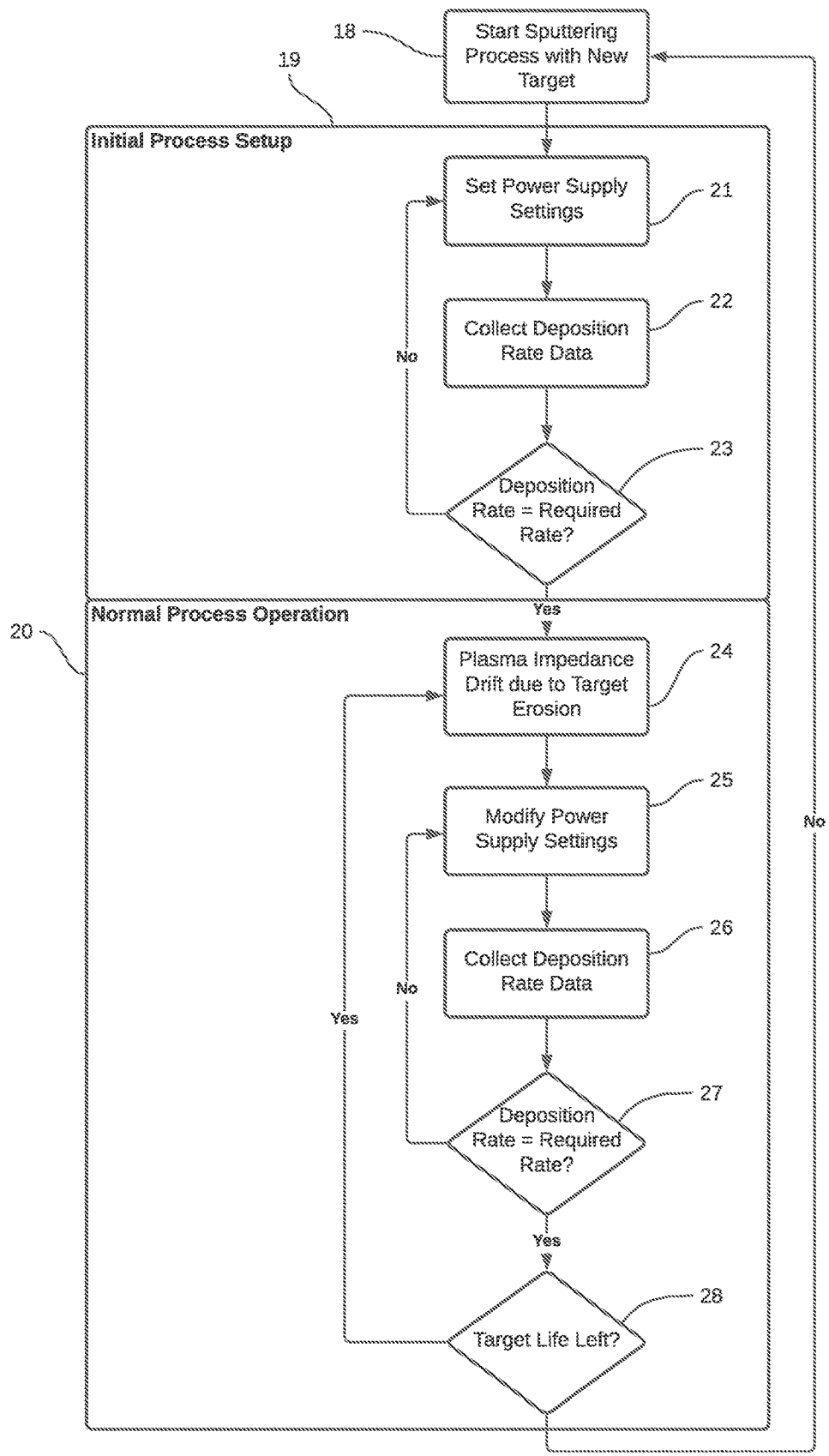
Figure 3 - Deposition Rate Control - Manual Magnet Bar - Prior Art

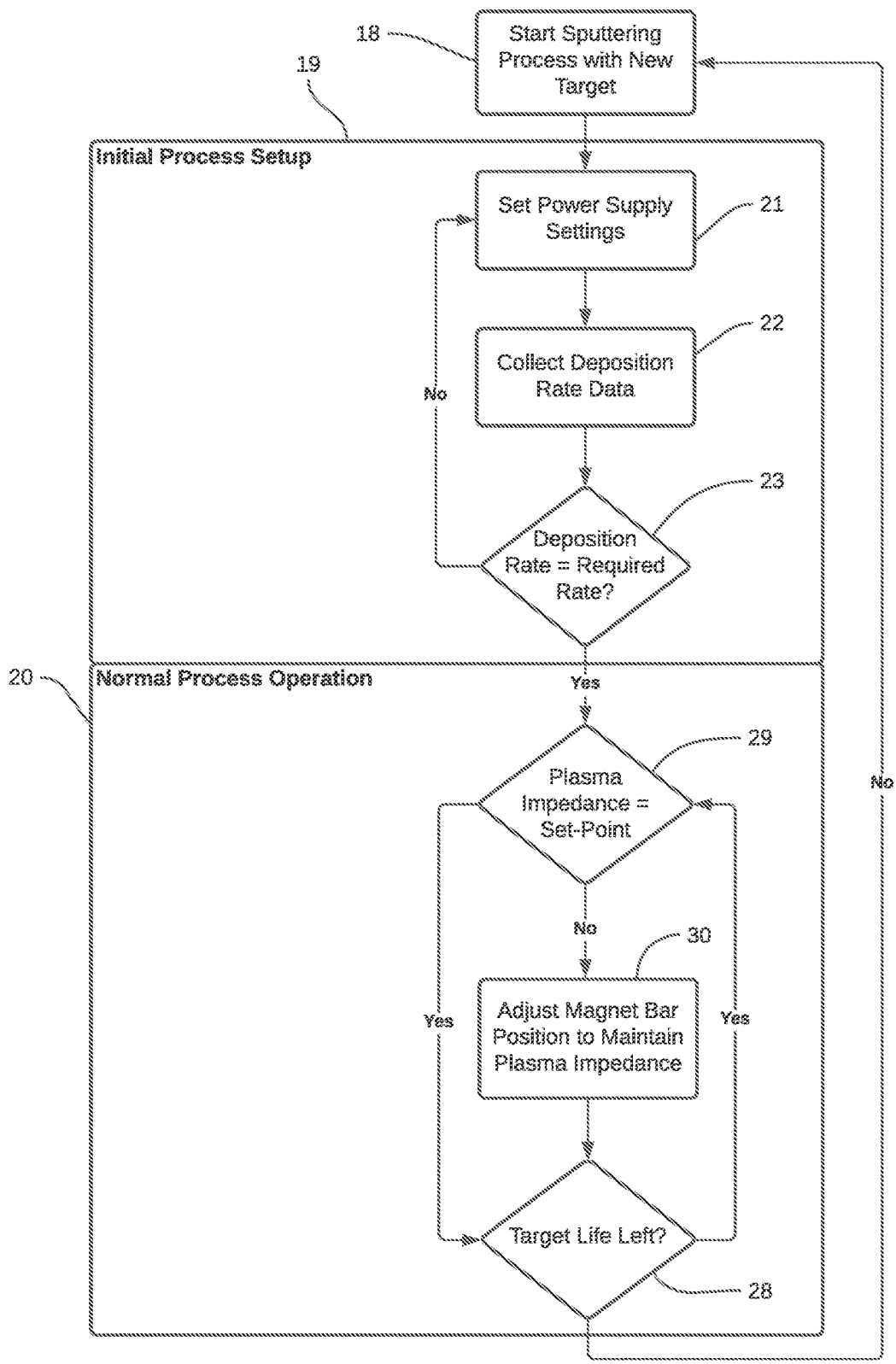
Figure 4 - Deposition Rate Control - Motorized Magnet Bar - Prior Art

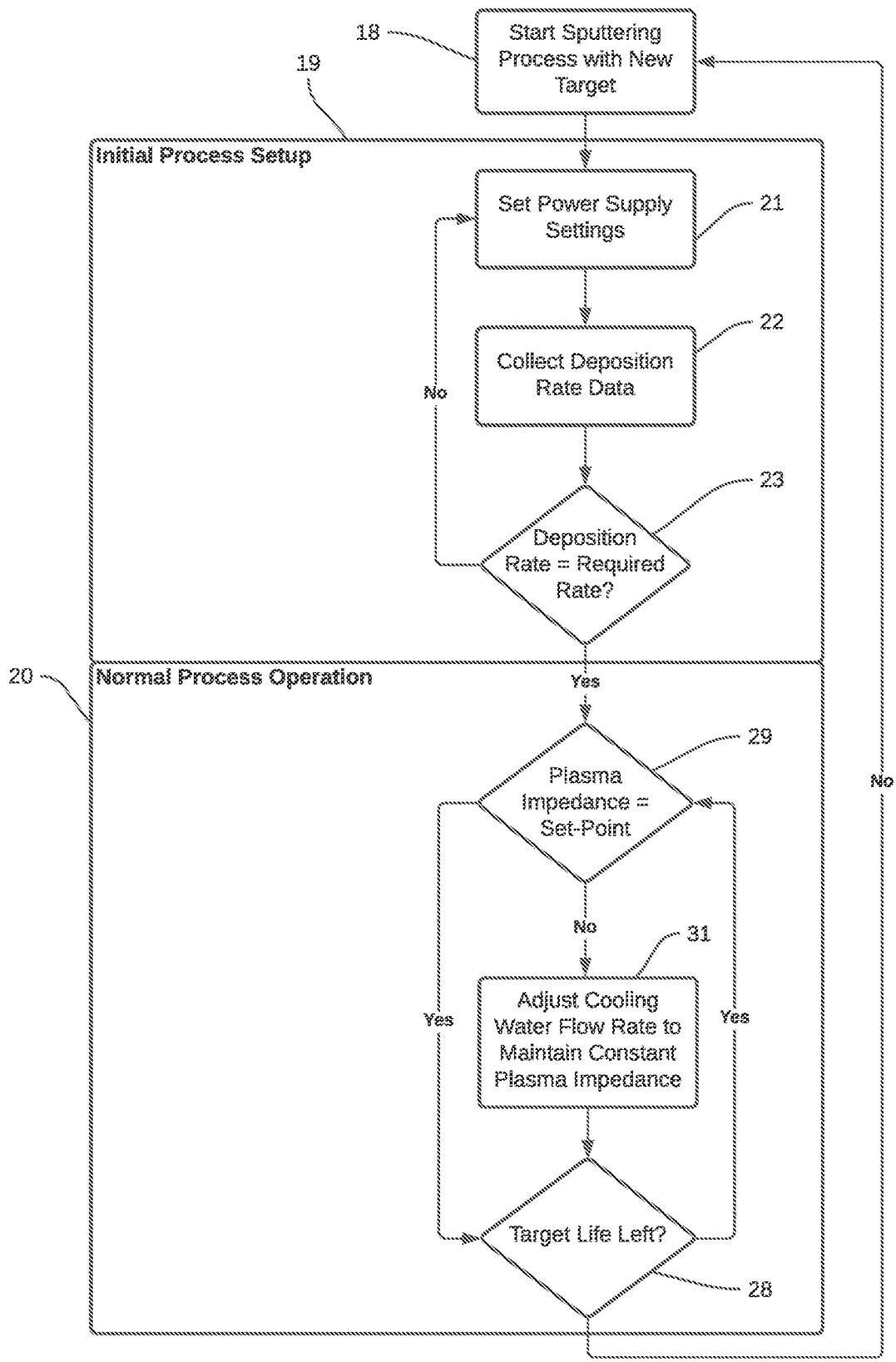
Figure 5 - Deposition Rate Control - Thermal Magnetic Adjusters

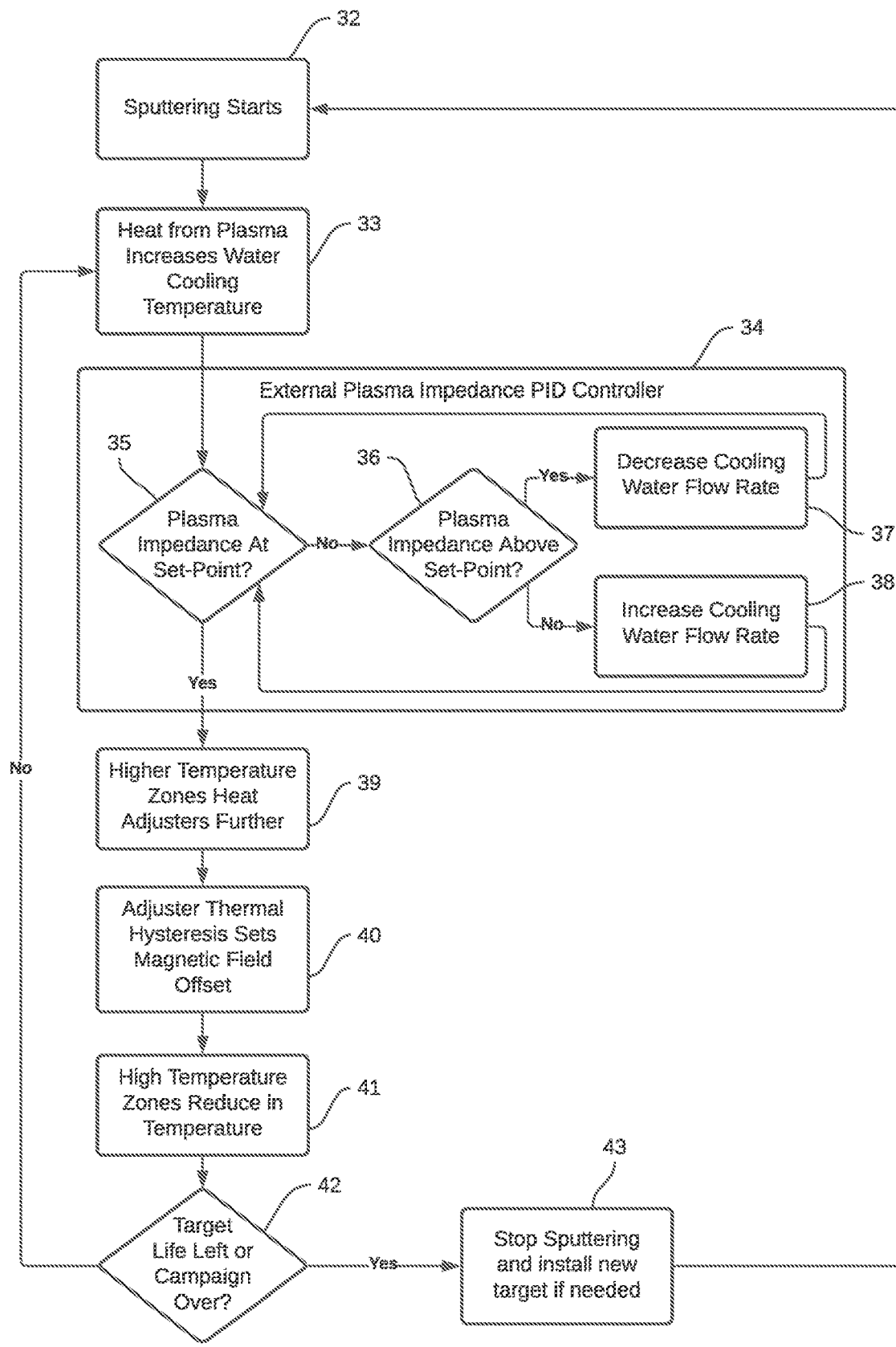
Figure 6 - Deposition Rate Control - Thermal Magnetic Adjusters

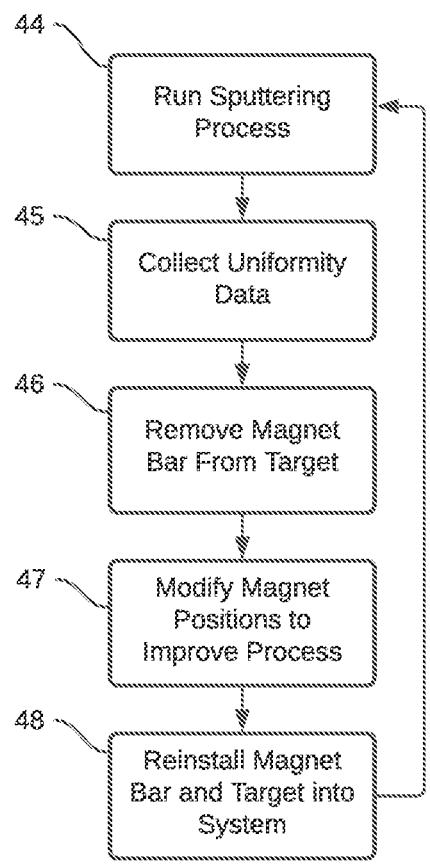
Figure 7 - Uniformity Control - Manual Magnet Bar - Prior Art

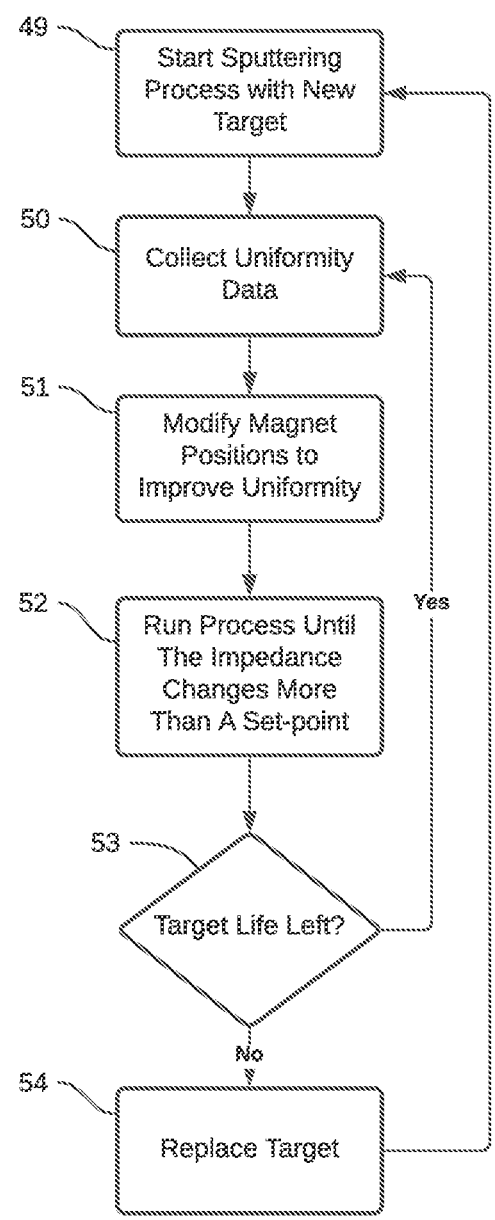
Figure 8 - Uniformity Control - Motorized Magnet Bar - Prior Art

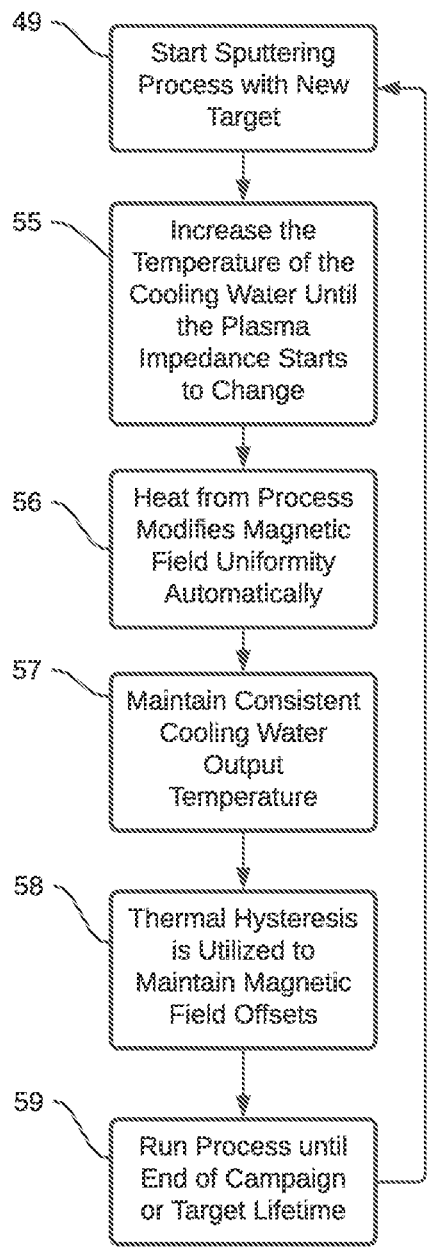
Figure 9 - Uniformity Control - Thermal Magnetic Adjusters

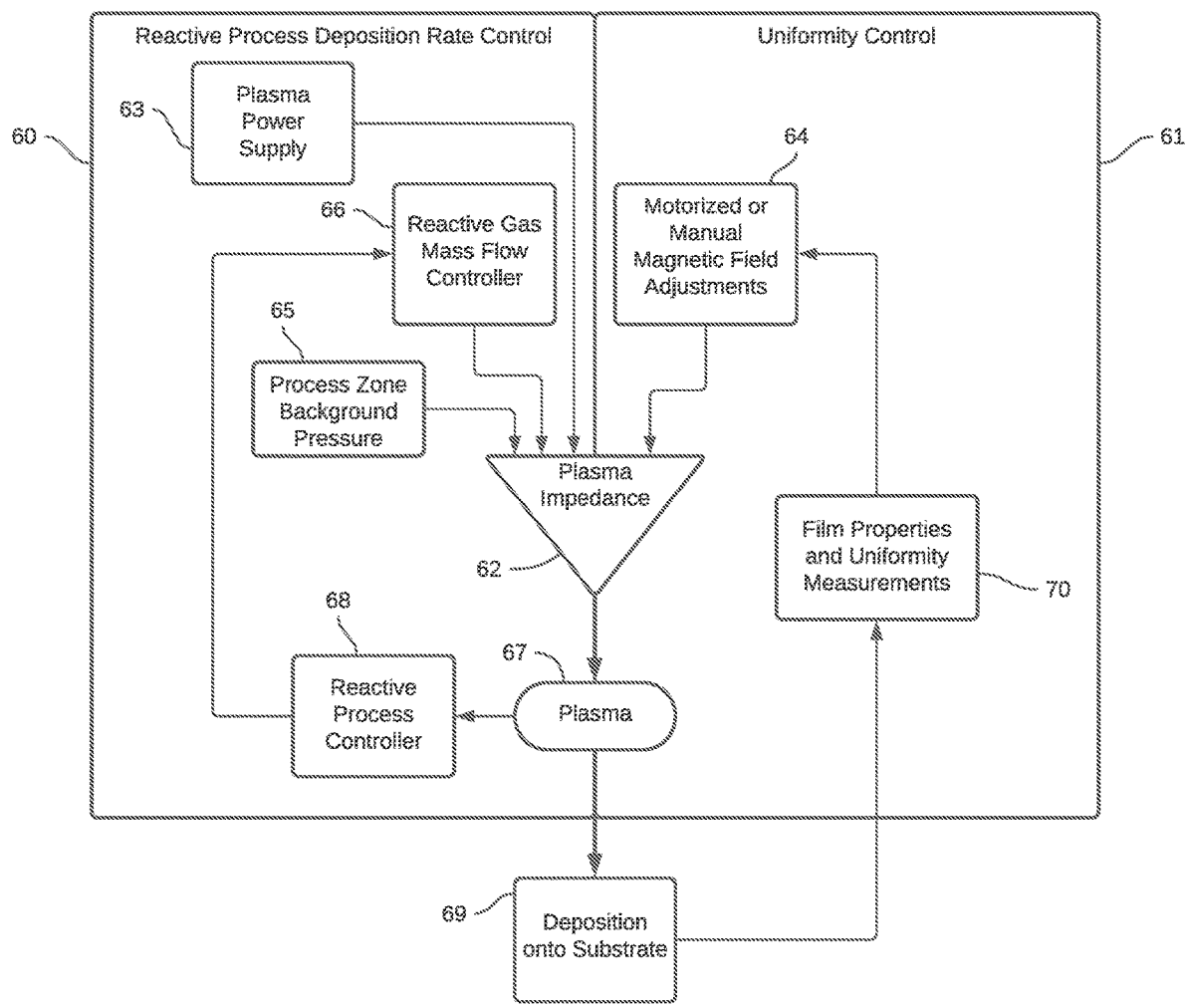
Figure 10 - Prior Art - Reactive Sputtering Control

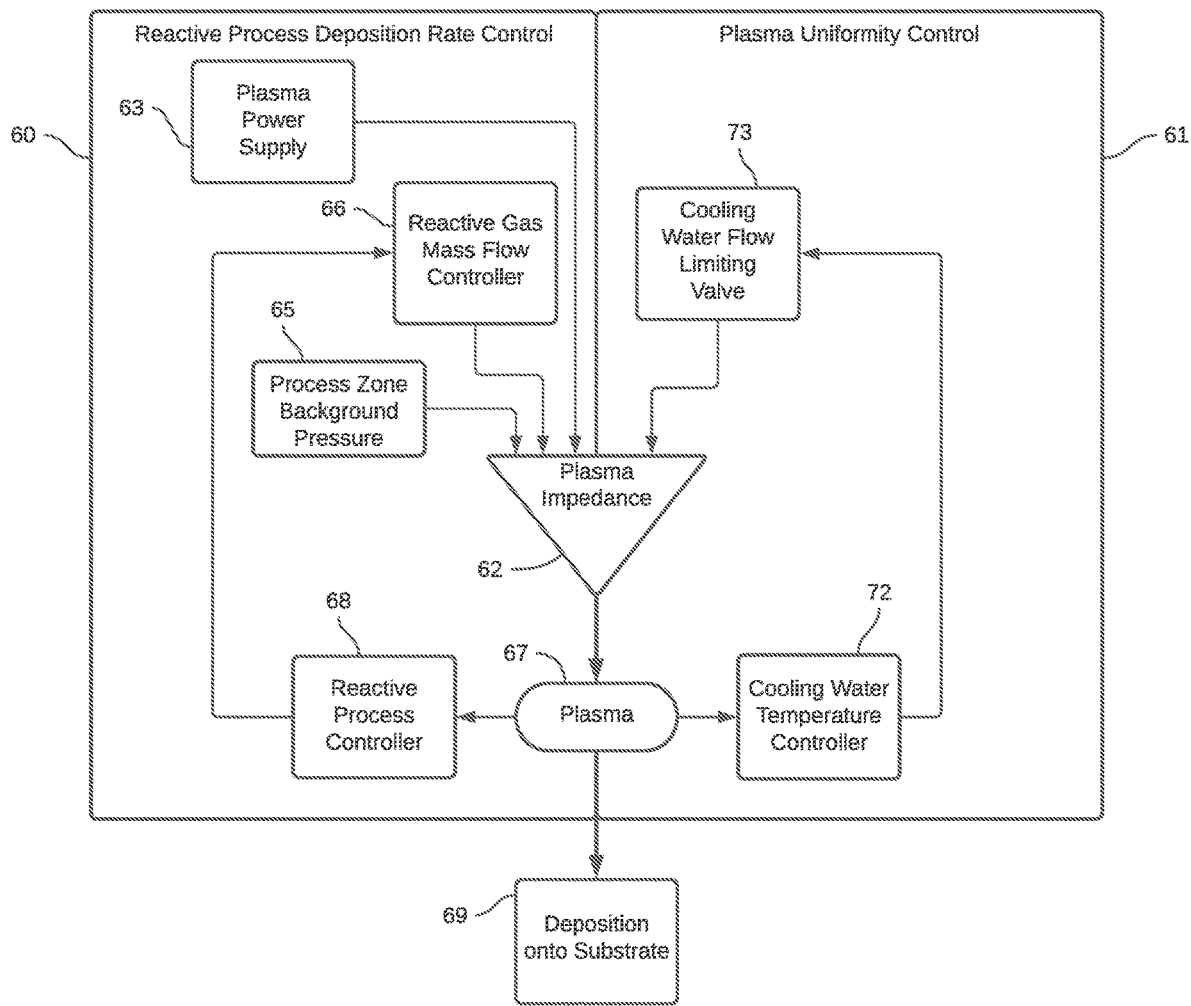

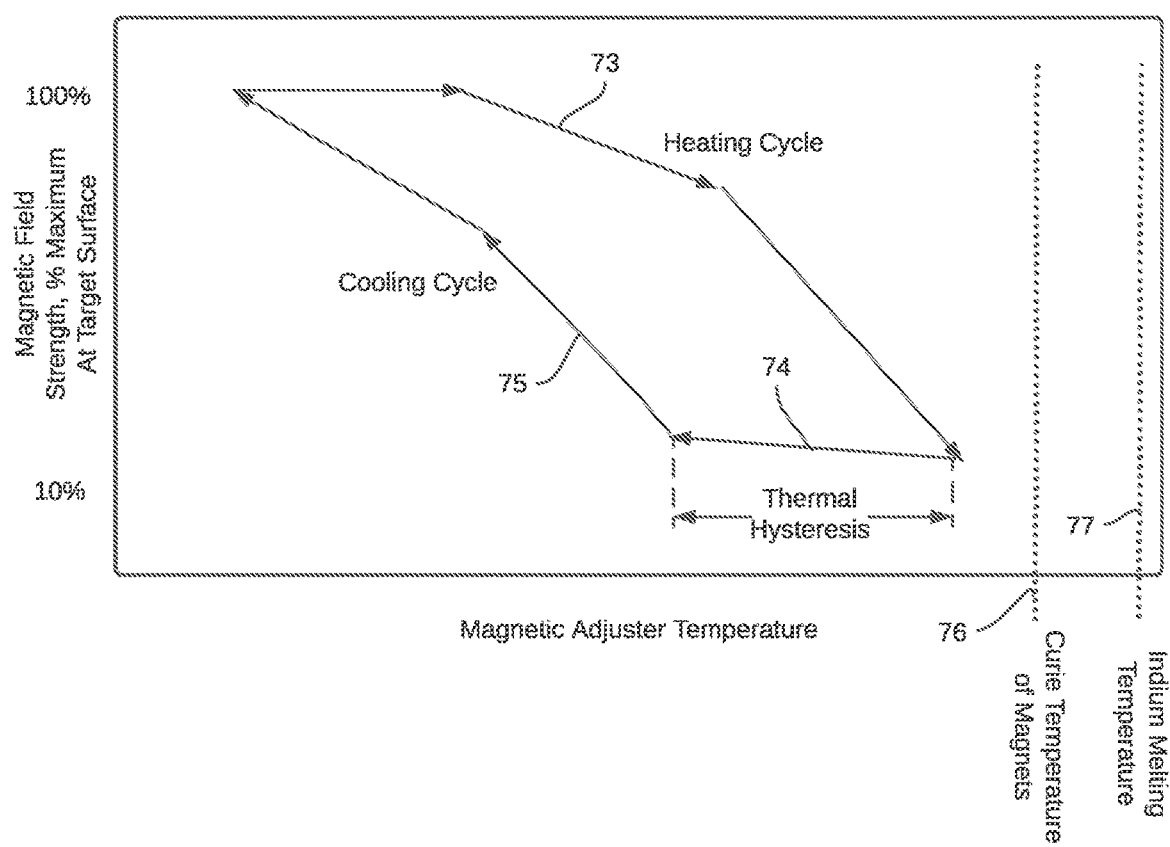
Figure 12 - Thermal Magnetic Adjusters - Magnetic Field Temperature Response

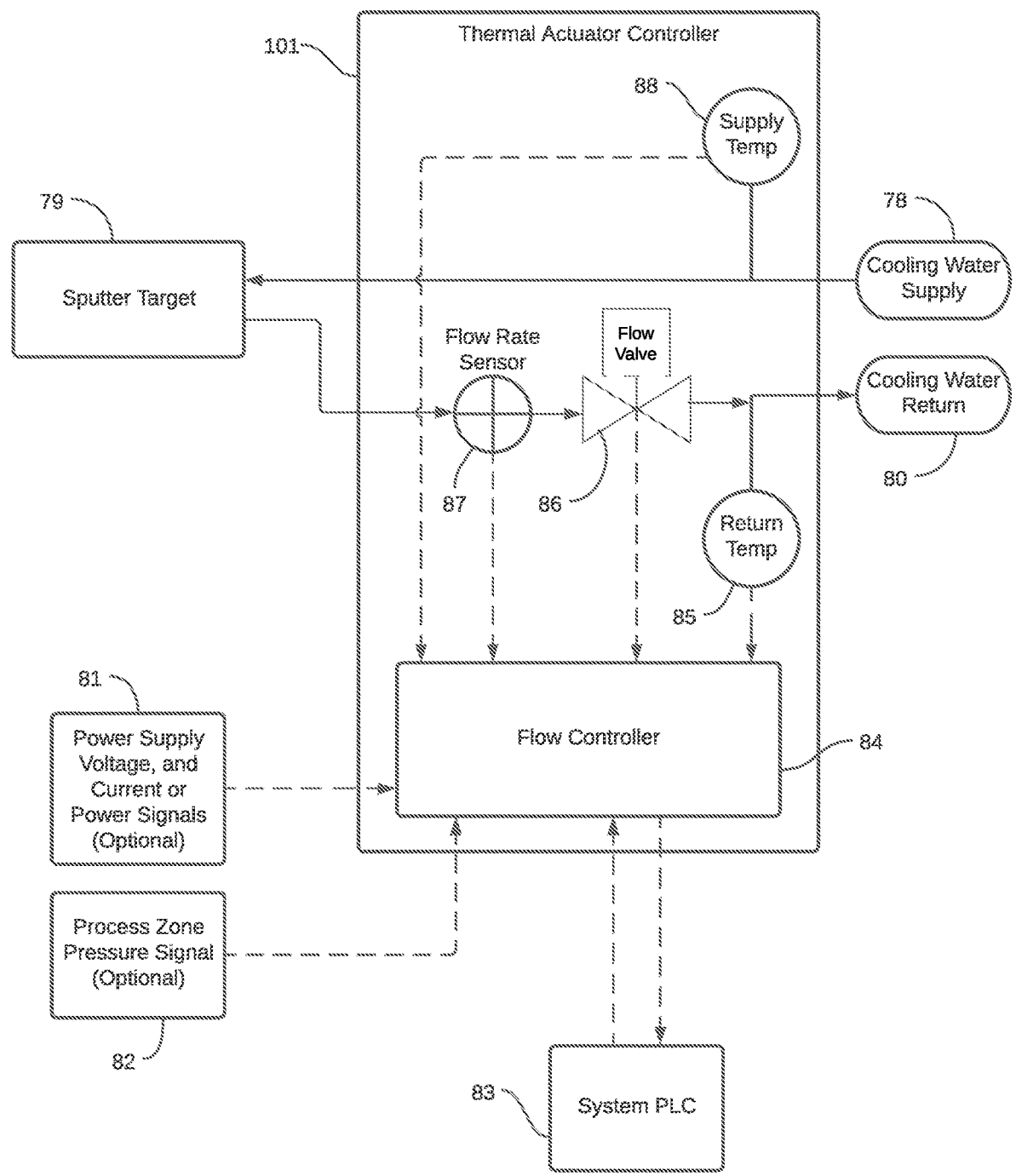
Figure 13 - Thermal Magnetic Adjusters Control By Temperature Response Figure 14 - Prior Art vs Thermal Magnetic Adjuster Water Flow Path
Prior Art Magnet Bar Water Path Along Rotation Axis
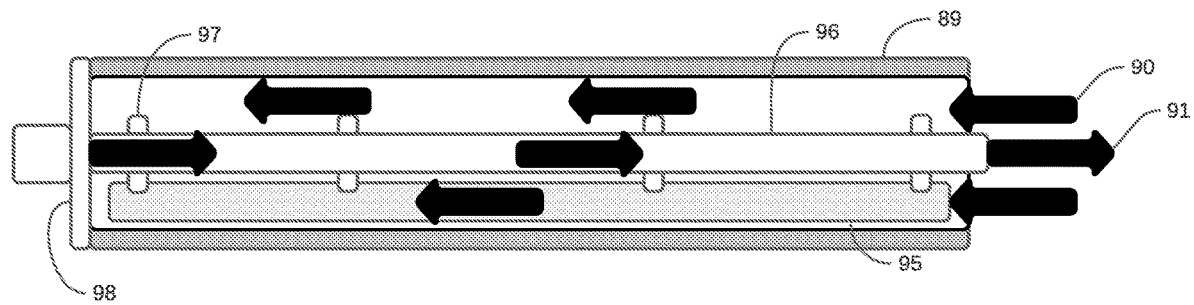
Thermal Magnetic Actuator Water Path Along Rotation Axis
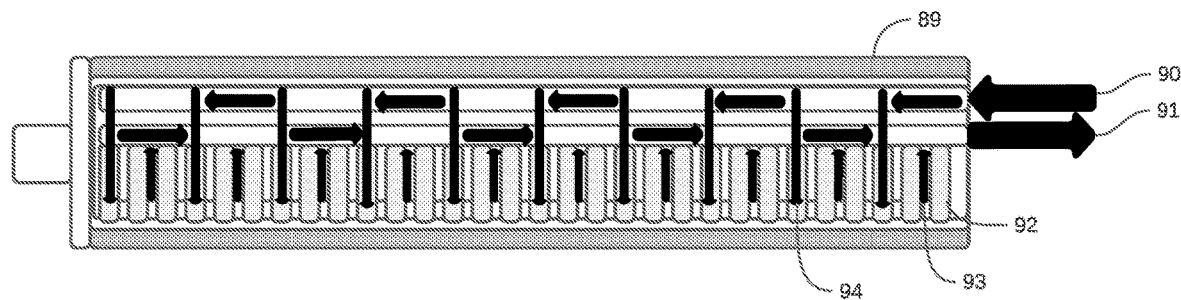
Thermal Magnetic Actuator Water Path Perpendicular to Rotation Axis
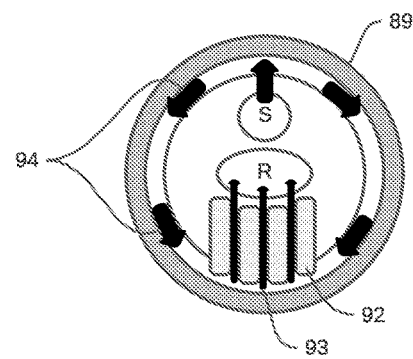

THERMALLY CONTROLLED MAGNETIC FIELDS OPTIMIZATION SYSTEM FOR SPUTTER DEPOSITION PROCESSES

CROSS REFERENCE TO RELATED APPLICATION

This patent application claims priority under 35 U.S.C. § 119(e) to U.S. Provisional Patent Application No. 63/135,179, entitled "THERMALLY CONTROLLED MAGNETIC FIELDS OPTIMIZATION SYSTEM FOR SPUTTER DEPOSITION PROCESSES," filed Jan. 8, 2021.

BACKGROUND

Field

The present disclosure relates generally to magnetically confined plasma sputtering systems and methods to control sputtering deposition processes over the lifetime of the target material to be sputtered.

Background

Existing magnetically confined plasma sputtering systems and methods typically, such as EP1412964B1, utilize fixed magnet bars and compensate for the changes in the sputtering rate and the plasma impedance caused by the changing distance between the target surface and the magnets as the target material is sputtered away by changing the power supply current and voltage to maintain a constant deposition rate.

In this regard, recent prior art technology, from U.S. Ser. No. 10/163,612B2 and U.S. Pat. No. 9,312,108B2, adopted by the large area thin film deposition industry uses electronically controlled magnet positioning systems to dynamically move the magnets over the lifetime of the target material to help compensate for the changing plasma impedance and sputter rate as well as to tune the deposition uniformity.

However, fixed magnets and electronically controlled magnet bars used in sputtering sources both require a post deposition feedback or an array of plasma and or deposition rate sensors to make the required adjustments to tune deposition uniformity. However, using such feedback requires both time and money, depending on the methods used.

Additionally, electronically controlled magnet bars have added complexity and cost with limited adjustability as the magnets are magnetically attached to a common magnetic yoke that either needs to be segmented or deflected to allow for uniformity adjustments. The electronically adjusted magnet bars can adjust the magnet distance from the target surface as the target material wears away, thereby allowing the plasma impedance to remain constant over the lifetime of the target material without making changes to the power supply settings. Fixed magnets can often be adjusted to tune uniformity much like the electronically controlled magnet bars but require removal from the sputtering source to do so which makes plasma impedance adjustments during the lifetime of a target material impractical.

Accordingly, there is a need for improved systems for controlling magnetically confined plasma sputtering systems and deposition processes over the lifetime of the target material to be sputtered.

SUMMARY

A thermally controlled magnet assembly in accordance with the present disclosure utilizes the thermal losses from the plasma sputtering process to modify the strength of the magnetic fields that control the plasma impedance and thus, the rate of the thermal losses to the thermally controlled magnet assembly creating a closed loop control system. Reducing the strength of the plasma confining magnetic fields as the temperature of the thermally controlled magnet assemblies increases causes the plasma impedance to increase for most sputtering processes. Increasing plasma impedance in turn decreases the thermal losses from the plasma as the voltage increases and the discharge current decreases.

For example, when sputtering a new target, the distance between the magnets and the surface of the target material being sputtered is largest. As the target material wears away, the surface being sputtered becomes progressively closer to the magnets and the strength of the magnetic fields confining the plasma increases, which thus better confines electrons in the plasma and reduces the plasma impedance. As the plasma impedance decreases, the number of ions hitting the surface of the target material increases and the thermal losses into the target material become larger. Cooling water can be used to keep the magnets and target material from overheating by transferring the thermal energy from the target material to the magnetic assemblies thereby causing the magnetic field at the surface of the target to reduce and in turn, limiting the plasma impedance.

When using the thermally controlled magnetic field assemblies, the distance between the target surface and magnets remains constant the entire target lifetime, assuming the assembly has a movement range that matches the thickness of the target and that the water flow is restricted as the target wears away to allow the thermally controlled magnetic field assemblies to get hot enough to move the required distance. If the plasma impedance remains the same throughout the lifetime of the target, the thermal losses would remain the same. Thus, for the thermally controlled magnetic field assemblies to continually adjust over the lifetime of the target, the temperature of the magnetic field assemblies needs to increase with the decreasing magnet to target surface distance.

To increase the temperature of the cooling water while the thermal losses remain the same from the plasma impedance, the cooling water flow rate can be reduced. In this regard, an electronically controlled valve on the water input or output can be used to reduce the water flow through the target, and thus increase the temperature of the thermally controlled magnetic field assemblies. The electronically controlled valve can be actuated using the plasma power supply voltage with the valve slowly closing until a required sputtering voltage setpoint is met or opening if the impedance becomes too high.

The thermally controlled magnetic field assemblies can also be used to automatically adjust the deposition uniformity along the length of the sputtering target. For example, where the sputtering rate is higher, the thermal losses to the cooling water are also higher and thus, the thermally controlled magnetic field assemblies will reduce the magnetic field strength and compensate for the non-uniformity. When the thermally controlled magnetic field assemblies heat up, the magnetic field decreases and the temperature and sputtering rate decreases, but once the temperature decreases, the thermally controlled magnetic field assemblies start cooling back down thus increasing the magnetic field again, though at a different rate than at which they decreased when heated due to a hysteresis in the thermally controlled magnetic field assemblies.

The hysteresis-based difference in the magnetic field when heating up versus cooling back down allows for compensation and/or incremental adjustment in one direction or another for deposition uniformity issues by preventing magnets in regions of higher heat to return to the same distance from the target surface until all the magnets have gone through a full controlled cooldown cycle. Modifying the magnetic field as a function of temperature hysteresis curves can be utilized to allow for larger or smaller uniformity corrections. The maximum temperature that the thermally controlled magnetic field assemblies reach during the heating cycle to set the uniformity adjustments will also determine the hysteresis-based difference between the original magnet positions and the optimized magnet position. Higher optimization temperature setpoints lead to larger uniformity adjustments when returning to the operating temperature.

In accordance with the present disclosure, the thermally controlled magnetic field assemblies can also be utilized to compensate for deposition uniformity issues by allowing the target cooling water to heat up to an adjustment point periodically instead of constantly running the target cooling water at higher temperatures. Reducing the water flow and heating the thermally controlled magnetic field assemblies to a set output water temperature adjusts the magnetic fields and then the plasma can be turned off and the water flow rate can be maximized to maintain the thermally controlled magnetic field assemblies very near to their current positions. If the water temperature stays below the minimum adjustment temperature, the magnetic fields will remain static. The rate of cooling once the magnets have been adjusted is important because if the thermally controlled magnetic assemblies do not cool fast enough, the magnetic fields will not be maintained. The rates of cooling to maintain the magnetic fields are a function of the design of the thermally controlled magnetic field assemblies.

In addition to using heat transferred from the plasma through the target and backing material to the cooling water, a remote sensor that is able to view the plasma can be utilized by looking at either the plasma intensity or the thermal radiation from the target surface being sputtered. This data from the remote sensor can then be used to manipulate a manual or motorized magnet bar to modify the thermal uniformity of the sputtering process. A temperature sensor could also be installed inside the cooling water path to measure the temperature of the cooling water with the data being used to mechanically adjust the distance between the magnets and the surface of the target.

BRIEF DESCRIPTION OF THE DRAWINGS

The accompanying drawings are included to provide a further understanding of the disclosure and are incorporated in and constitute a part of this specification, illustrate embodiments of the disclosure, and together with the description serve to explain the principles of the disclosure, wherein:

FIG. 1 is a cross-sectional diagram of an exemplary prior art thin film plasma sputtering deposition system with a cantilevered cylindrical rotary cathode sputtering onto a horizontal substrate;

FIG. 2 is a cross-sectional diagram of an exemplary prior art thermally controlled magnetic field optimization system for a thin film plasma deposition system with a cantilevered cylindrical rotary cathode sputtering onto a horizontal substrate;

FIG. 3 is a flow chart showing the operation of prior art manual magnet bars using power supply settings to maintain a constant deposition rate over the life of the target material as a plasma impedance changes;

FIG. 4 is a prior art flow chart for deposition rate control when using a magnet bar with motorized adjusters;

FIG. 5 is a flow chart for deposition rate control for thermal magnetic adjusters in accordance with the present disclosure;

FIG. 6 is another flow chart for deposition rate control for thermal magnetic adjusters and how the thermal hysteresis is used in accordance with the present disclosure;

FIG. 7 is a prior art flow chart for uniformity control when using manual magnet bars;

FIG. 8 is a prior art flow chart for uniformity control when using motorized adjuster magnet bars;

FIG. 9 is a flow chart for uniformity control when using thermal magnetic adjusters;

FIG. 10 is a prior art reactive sputtering process control flow chart showing the primary factors that control the plasma impedance when using a manual or motorized magnetic field adjustment system;

FIG. 11 is a reactive sputtering process control flow chart showing the primary factors that control the plasma impedance when using thermal magnetic adjusters in accordance with the present disclosure;

FIG. 12 is a plot of the magnetic field strength on the surface of the target material as a function of the cooling water temperature around the thermal adjusters for heating and cooling cycles in accordance with the present disclosure;

FIG. 13 is a schematic for controlling the thermal magnetic adjusters using the temperature response when measuring the output water flow rate and temperature in accordance with the present disclosure; and FIG. 14 compares the schematics of water flow of prior art manual and motorized magnet bars with the water flow for the thermal magnet adjusters in accordance with the present disclosure.

DETAILED DESCRIPTION OF THE ILLUSTRATED EMBODIMENTS

Persons skilled in the art will readily appreciate that various aspects of the present disclosure can be realized by any number of methods and systems configured to perform the intended functions. Stated differently, other methods and systems can be incorporated herein to perform the intended functions. It should also be noted that the accompanying drawing figures referred to herein are not all drawn to scale but may be exaggerated to illustrate various aspects of the present disclosure, and in that regard, the drawing figures should not be construed as limiting. Finally, although the present disclosure can be described in connection with various principles and beliefs, the present disclosure should not be bound by theory.

In general, the present disclosure provides systems and methods to enhance thin film deposition uniformity and target utilization from large area sputtering cathodes. By way of background, FIG. 1 shows a prior art example of a simplified cross section of a cylindrical rotary cathode target material (1) on a backing tube (2) with a permanent magnet array (3) attached to a static central support tube (4) using adjustable mounting brackets (5). The adjustable mounting brackets (5) allow the permanent magnet array (3) to be adjusted closer or farther away from the surface of the target material (1) to help control the intensity of the plasma (6) in order to tune the deposition uniformity on the surface of the substrate (7).

For most target materials, as the plasma confining magnetic field strength is increased on the surface of the target material (1) the plasma (6) impedance will decrease, allowing more ions to be created at lower discharge voltages and typically increasing the sputter rate (assuming the sputter yield does not drop off significantly with lower discharge voltages). The illustrated rotary cathode sputtering process takes place within a vacuum chamber (8) and the rotary cathode target is supported with the target mounting clamps (10) from an end block (9) which, as illustrated in FIG. 1, is attached to the vacuum chamber (8) wall.

The sputtering process requires high voltage plasma power supplies (11) to sustain the plasma (6). These power supplies are typically controlled either manually or via a process control computer (12). The process control computer will often change the pressure of the process gasses that are fed into the vacuum chamber (8) to help control the plasma (6) impedance of the sputtering process. The plasma power supply (11) can be configured to report the voltage of the plasma (6) to the process control computer (12) and a control loop can be utilized to keep the process gas pressure at a value that helps maintain a constant voltage. As the target material (1) is sputtered away over the lifetime of the target, the distance between the permanent magnet array (3) decreases and thus, the magnetic confinement strength of the surface of the target material increases which, in turn, further decreases the plasma (6) impedance. If the process control computer (12) attempts to compensate for the change in the plasma (6) impedance using the process gas pressure in the vacuum chamber (8) the pressure will need to be significantly decreased over the lifetime of the target which can change various other important properties of the film deposited on the substrate (7) including, among others, the thickness, density, optical properties, electrical properties, and various mechanical properties such as stress.

To overcome the process issues associated with the plasma (6) impedance changing over time as the target material (1) is sputtered away, adjustable mounting brackets (5) have been replaced with adjusters that are manipulated from outside the target backing tube (2) and vacuum chamber (8). Manipulating the adjustable mounting brackets (5) while the sputtering process is running or while the target is still installed on the end block (9) allows operators to adjust the plasma (6) intensity to compensate for thin film uniformity and plasma (6) impedance issues over the lifetime of the target material (1). The adjustable mounting brackets (5), when driven by external mechanisms, typically require sputtered thin film property information collected from the substrate (7) or measured directly from the sputtering process by analyzing the plasma (6) spectral intensity along the length of the target with one or more optical spectrometers to provide operators with the required information on how to adjust the permanent magnet array (3) with the adjustable mounting brackets.

When sputtering, thermal energy from the plasma (6) is transferred to the surface of the target material (1) when ions bombard the surface to sputter the target material (1). The thermal energy lost in the sputtering process to the target material (1) travels through the target backing tube (2) and is removed by cooling water (13) flowing through the target backing tube (2) and then back out the central support tube (4) to a cooling water return (14). Depending on the configuration of the hardware, the direction of the cooling water flow can be reversed, flowing through the central support tube (4) first and then through the target backing tube (1). The temperature of the cooling water inside the target is a function of the cooling water flow rate, the inlet water temperature, the plasma (6) impedance, and the plasma power supply (11) settings.

FIG. 2 shows a similar, prior art cantilevered rotary cathode assembly with a thermally controlled magnetic field optimization system. With this prior art design, an array of thermally controlled magnetic adjusters (15) is utilized instead of the permanent magnet array (3) of FIG. 1. These thermally controlled magnetic adjusters (15) are mounted in an adjuster housing (16) that directs a cold supply water out the side of the adjuster housing (16) that is opposite of the plasma (6) and then back into the adjuster housing (16) around the thermally controlled magnetic adjusters. By releasing the water along the length of the target backing tube (2) instead of into one end of the target like the aforementioned prior art design of FIG. 1, the temperature of the cooling water will not change with target length and thus. the thermally controlled magnetic adjusters (15) will perform the same for all possible target lengths.

With continuing reference to FIG. 2, when the sputtering process begins, the target will take some time to reach a thermal equilibrium. As the cooling water temperature starts to increase inside the target backing tube (2), the thermally controlled magnetic adjusters (15) will start to decrease the magnetic field and thus increase the plasma (6) impedance. If magnetic or electrical uniformity issues exists in the plasma (6), the thermal losses to the target material (1) in those locations will be greater and the local heat supplied to the cooling water will cause the thermally controlled magnetic adjusters (15) to decrease the magnetic field in those locations more than other cooler locations along the length of the target.

As the temperature of hot spots in the plasma (6) decrease due to the decreasing magnetic field strength, the temperature of the thermally controlled magnetic adjusters (15) will also decrease and the magnetic field will in turn increase at a slower rate as a function of the hysteresis in the thermally controlled magnetic adjusters (15).

In the embodiment of FIG. 2, the temperature of cooling water around the thermally controlled magnetic adjusters (15) needs to, at a minimum, be near the beginning of a transition temperature in which the magnetic field starts decreasing in order to correctly tune the magnets and optimize the plasma (6) density across the length of the entire target material (1). To control the temperature that the thermally controlled magnetic adjusters (15) are exposed to, a water temperature and flow controller (17) can be placed between the end block (9) and the cooling water supply (13) and return (1).

The water temperature and flow controller (17) measure the temperature and flow rate of return water along with the temperature of the supply water to determine the heat load removed from the cooling water and adjust the cooling water flow rate. The water temperature and flow controller (17) can be connected to the plasma power supply (11) and the process control computer (12) to monitor and control the plasma impedance by adjusting the water flow to maintain the appropriate temperature of the thermally controlled magnetic adjusters (15). For example, decreasing the water flow rate as the plasma (6) impedance decreases can heat the thermally controlled magnetic adjusters (15) enough to maintain a constant plasma (6) impedance throughout the useful life of the target material (1). In some configurations of the thermally controlled magnetic adjusters (15) that use a phase change material to change the magnetic field strength, the thermally controlled magnetic adjusters (15) can be heated to reach the plasma impedance setpoint and then rapidly cooled by increasing the cooling water flow rate to lock the magnetic fields at the setpoint.

FIG. 3 illustrates how prior art manual adjustment magnet bars are used for deposition rate control over the lifetime of a target material. The process starts with a new target (18) that is ramped up to a set power level (21). When at the initial power supply setting (21), the operator collects deposition rate samples (22) to verify the correct deposition rate is being met. If the deposition rate (22) is not correct, the operator adjusts the power supply settings (21) and collects deposition rate data (22) again, repeating this process until it is correct (23). Once the deposition rate is correct (23), the sputtering process can run continuously until the target material wears away far enough to change the plasma impedance (24). When the plasma impedance (24) changes enough, the operator must modify the power supply settings (25) and then collect new deposition rate data (26), repeating this process until the deposition rate equals the required rate (27). This process continues until the target life has ended (28).

FIG. 4 illustrates a prior art deposition rate control process flow diagram for a prior art motorized magnet bar that can make changes to the magnetic field strength from control signals from outside the vacuum chamber. The deposition rate control over the lifetime of the target for motorized magnet bars is very similar for the initial process setup (19). The primary difference is that the plasma impedance can be monitored with regards to a setpoint (29) and then the magnetic field can be modified to maintain the plasma impedance (30) until the end of the target life (28). Adjusting the magnetic field from outside the vacuum chamber as the process is running or just without taking the target out of the vacuum chamber to make magnetic modifications allows the control of the deposition rate to switch from changing the power supply settings as the target wears away to keeping the deposition rate and target impedance constant by changing the magnetic field with the erosion of the target.

With reference now to FIG. 5, a flow chart diagram for deposition rate control using the thermal magnetic adjusters in accordance with the present disclosure is illustrated. When using the thermal magnet adjusters, the initial process setup (19) remains the same as those known in the prior art but with changes to the normal process operations (20). In the normal process operation (20), the plasma impedance setpoint (29) signal comes from the power supply voltage and the cooling water flow is adjusted to maintain a constant plasma impedance (31).

FIG. 6 is a detailed process flow diagram of the deposition rate control for thermal magnetic adjusters in accordance with the present disclosure. Once the sputtering has started (32), heat from the plasma increases the cooling water temperature (33) and an external plasma impedance PID controller (34) is used to modulate the cooling water flow as a function of the plasma impedance. The external plasma impedance PID controller (34) takes a voltage signal from the plasma power supply and compares that voltage to a set-point (35) and then checks if the plasma impedance is above the set-point (36). Based on this check, the cooling water flow rate decreases (37) if above the set-point or increases (38) if below the set-point. Once the plasma impedance is at the setpoint (35), any higher temperature zones along the racetrack will heat the adjusters (39) more than cooler sections of the plasma. The thermal hysteresis of the magnetic field thus keeps the offset (40) set while the temperature may vary up and down during operation.

If the thermal hysteresis did not exist, the magnetic field would increase as soon as the temperature of the hotter zones dropped (41) due to the drop in the magnetic field strength. Once the process has been fully set, it loops through the entire process until the target life or campaign is over (42). When the campaign/process is over, the sputtering stops and, if required, the target is changed (43).

FIG. 7 is a prior art flow chart illustrating uniformity control using a manual magnet bar. As illustrated, once the sputtering process starts (44), the operator will must collect uniformity data (45). To adjust the uniformity, the operator must remove the magnet bar from the target (46) and make the adjustments manually to improve the uniformity of the process (47). Once the modifications have been made, the magnet bar can be reinstalled into the system (48) and the uniformity control process can start over again.

With reference now to FIG. 8, a prior art uniformity control process flow chart for motorized magnet bars is shown. After sputtering has started with a new target (49), an operator or automated system collects uniformity data (50) from the thin films sputtered onto a substrate and then the operator or automated system modifies the magnet positions to improve the uniformity (51). The process then runs at this setting until the target impedance changes beyond a setpoint (52) and if there is still target life left (53), then the uniformity adjustment loop runs continuously until the end of the target lifetime and if there is no target life left, the target is replaced (54).

FIG. 9 is a uniformity control process flow chart for the thermal magnetic adjusters in accordance with the present disclosure. Once the start of the sputtering process with a new target (49) has been initiated, the plasma will increase the temperature of the cooling water until the plasma impedance starts to change (55). At this point, the heat from the process has modified the magnetic field uniformity automatically (56) and thus, to keep the magnetic field correctly modified, the cooling water output temperature is maintained as a constant (57). The thermal hysteresis of the thermal magnetic adjusters is thus utilized to maintain the magnetic field offsets (58) required to prevent oscillations in uniformity and process heat along the length of the racetrack. When the process is properly set and the output water temperature is maintained at a constant value, the thermal magnetic adjusters will maintain the optimized uniformity until the end of the campaign or target lifetime (59).

FIG. 10 is a prior art reactive sputtering control flow diagram showing various systems used to control the reactive process deposition rate (60) and the uniformity (61). In this illustration, all the control sources for reactive sputtering control directly attribute to the plasma impedance (62). The process zone background pressure (65), which is typically composed of argon gas (though other inert or non-reactive gases may be used), directly controls the range of the possible plasma impedance (62) for the process. The plasma power supply (63) combined with the reactive gas flow rate from the reactive gas flow controller (66), sets the bulk deposition rate of the process. Motorized or manual adjusted magnetic field (64) may be used to control the baseline uniformity of the reactive sputtering process. The reactive gas flow can be segmented into multiple zones within the sputtering chamber to modify the uniformity by changing the local plasma impedance by modifying the secondary electron emission of the target material where the partial pressure of the reactive gas is the higher. The process typically begins by bringing the process zone background pressure (65) to a set level after which the plasma power supply (63) is started. Once the plasma (67) is in process, the reactive gas mass flow controller (66) is started at a low value until the reactive process controller (68) can take a signal created by the plasma (67) in the form of an optical, plasma impedance (62) on the plasma power supply (63), or reactive gas partial pressure left over after the consumption of gas in the plasma. When the reactive process is functioning properly, the plasma (67) causes the target to sputter on to the substrate (69) which can then be measured to determine the film properties and uniformity measurements (70) that can be used to modify the magnetic fields to help improve the baseline uniformity.

The reactive sputtering process deposition rate for most materials is a function of the secondary electron emission rate of the material and changes as the reactive gas partial pressure changes the temperature transferred to the target material changes. FIG. 11 shows a reactive sputtering control process schematic for the thermal magnetic adjusters in which the plasma uniformity control (61) becomes a closed loop process that does not require operator assistance to tune the uniformity. As illustrated, with this process, the cooling water temperature that is directly affected by the plasma (67) feeds the water out of the target to a cooling water temperature controller (72) that maintains a cooling water setpoint by controlling a cooling water flow limiting valve (73) which in turn directly controls the bulk temperature of the thermal magnetic adjusters. From the setpoint of the cooling water temperature controller (72), the bulk impedance is controlled, and the thermal magnetic adjuster hysteresis properties ensure that any hot spots on the target from either reactive gas concentration or magnetic field strength will be reduced to help even out the process.

With reference now to FIG. 12, a plot of the magnetic field temperature response for the thermal magnetic adjusters in accordance with the present invention is shown. In the plot, the y-axis is the magnetic field strength at the surface of the target with the units of percentage of the maximum field that the magnets can produce on the surface of the target. When at low temperatures, the magnetic field on the surface of the target is at the maximum level and as the temperature rises, the magnetic field on the surface of the target reduces. As the temperature of the thermal magnetic adjusters starts to rise, the heating cycle (73) of the process starts. When the heat of the process stops increasing, the thermal hysteresis (74) allows the thermal magnetic adjusters to cool with minimal increases in the magnetic field strength until the temperature drops far enough to reach the cooling cycle (75) and the magnetic field starts increasing again. The maximum temperature of the heating cycle is below the curie temperature of the magnets (76) and the indium melting temperature (77) for indium bonded targets. When the magnetic field drop during the heating cycle (73) is large enough to extinguish the plasma, the plasma impedance is increased until the power supply can no longer sustain the plasma. When the plasma is extinguished as the temperature rises too high, the curie temperature of the magnets (76) and the indium melting temperature (77) may never be met, which reduces the chance of damaging the magnets or the target material.

Utilizing a phase change material as the primary mechanical means of changing the strength of the magnetic fields in the thermally controlled magnetic adjusters (15) allows for tuning of the material properties to adjust the hysteresis curve of the thermally controlled magnetic field response. The initial melting temperature of the material and the rate of expansion of the materials can be tuned with additives. Tuning the properties of the permanent magnets is also possible. Increasing the reversable thermal response attenuation of the neodymium magnets below the curie temperature would allow for a thermally controlled magnetic adjuster (15) with no moving parts.

Moreover, utilizing at least one phase change material to melt and fully expand to stop the plasma sputtering process due to an increasing plasma impedance at a temperature lower than a critical temperature which would otherwise damage the target material or a bonding layer of the target material.

FIG. 13 shows a schematic for controlling a sputtering process using the temperature response for the thermal magnetic actuators in accordance with the present disclosure. The thermal actuator controller (101) has the cooling water supply (78) going to the sputtering target (79) and then the return water flows to the cooling water return (80). A signal from the power supply (81) and process zone pressure (82) is optional but can be used to further control the process. The sputtering system PLC (83) can also be connected to the flow controller (84) to display the values from the flow controller (84) inputs and to set the process set point. The cooling water return temperature (85) is primarily used to monitor the bulk temperature of the thermal magnetic adjusters and should determine the baseline plasma impedance. The cooling water return flow valve (86) is the primary control device for the thermal magnetic adjuster bulk magnetic set point. When using a flow rate sensor (87), the supply temperature (88), and the return water temperature (85), the power loss to the cooling water can be determined. The power loss compared to the input power from the power supply (81) can be used to determine a reactive sputtering process point for some materials in lieu of using other reactive process controllers. The cooling water supply (78) is not always as stable as the equipment cooling so the water may cycle on and off, causing supply water temperature changes that could be greater than the hysteresis, thus causing the process to change. The cooling water supply temperature (88) can monitor the cooling water supply (78) and adjust the flow valve to compensate the supply water temperature changes from the cooling equipment to stabilize the process.

FIG. 14 is an illustration of prior art versus thermal magnetic adjuster in accordance with the present disclosure for comparison for the cooling water flow path. The top image is the prior art horizontal rotary target design in which the cooling water input (90) enters the target tube (89) around the magnet bar (95) central water tube (96) and manual or motorized adjusters (97) and then flows through the target end cap (98) and finally back though the central water tube (96). In this prior art design, the cooling water flowing along the axial direction of the target rotation is doing the cooling of the target tube (89) and the heat transferred to the cooling water will build as the water travels along the length of the target tube (89). The collection of the heat along the length of the target tube (89) makes this design an issue for the use of thermal magnetic adjusters as the temperature of the cooling water increases with distance away from the water inlet.

To counteract this buildup of heat along the length of the target tube (89), the second image shows a diagram of a horizontal rotary target tube (89) with a thermal magnetic adjuster assembly in which the inlet water (90) enters a cavity within a housing that distributes the water along the length of the target tube (94) so it can flow between the central housing and the target tube (89) and then around the outside of the thermal magnetic adjusters (92) and into a return cavity. This water motion allows the heat produced by the plasma along the length of the target tube (89) travels to the thermal magnetic adjusters responsible for the heat generation instead of along the target. This has an added benefit of making the target tube (89) temperature much more uniform along the length of the target tube (89). The final image is a cross-sectional view perpendicular to the rotation axis of the target tube (89). In this view the cooling water comes out the supply cavity and then flows between (94) the central housing and target tube (89), then it flows around (93) the thermal magnet adjusters (92) and into the return cavity (91).

Finally, it will be apparent to those skilled in the art that various modifications and variations can be made in the present disclosure without departing from the spirit or scope of the disclosure. Thus, it is intended that the present disclosure cover the modifications and variations of this disclosure provided they come within the scope of the appended claims and their equivalents.

Likewise, numerous characteristics and advantages have been set forth in the preceding description, including various alternatives together with details of the structure and function of the devices and/or methods. The disclosure is intended as illustrative only and as such is not intended to be exhaustive. It will be evident to those skilled in the art that various modifications may be made, especially in matters of structure, deposition materials, elements, components, shape, size and arrangement of parts including combinations within the principles of the invention, to the full extent indicated by the broad, general meaning of the terms in which the appended claims are expressed. To the extent that these various modifications do not depart from the spirit and scope of the appended claims, they are intended to be encompassed therein.

I claim:

1. A magnetic field control device for a plasma sputtering process, comprising:
   at least one thermally controlled magnetic field assembly with at least one magnet that modifies a magnetic field strength of a plasma confining magnetic field on a sputtering surface of a target material based on a local temperature of cooling water directed proximate a specific magnet, the cooling water used to remove local thermal energy transferred to the target material from the plasma sputtering process; and
   a housing structure containing the at least one thermally controlled magnetic field assembly that directs the cooling water to the specific magnet to deliver heated cooling water to thermally controlled magnetic field assembly for changing a local plasma intensity on the sputtering surface of the target material.

2. The magnetic field control device of claim 1, wherein at least one phase change material controls the magnetic field strength.

3. The magnetic field control device of claim 1, wherein a thermal hysteresis of the magnetic field control device is tuned to allow incremental magnetic field adjustment in one direction until a threshold temperature is achieved.

4. The magnetic field control device of claim 2, wherein the at least one phase change material melts and fully expands at a temperature lower than a curie temperature of the at least one magnet.

5. The magnetic field control device of claim 2, wherein the at least one phase change material melts and fully expands to stop the plasma sputtering process due to an increasing plasma impedance at a temperature lower than a critical temperature that damages at least one of the target material and a bonding layer.

6. The magnetic field control device of claim 1, wherein at least one temperature sensor measures a target temperature and based on the target temperature, the magnetic field strength is modified with a mechanical mechanism.

7. The magnetic field control device of claim 1, wherein at least one material property of the at least one magnet reversibly alters the magnetic field strength produced on a target material surface as a function of a magnet surface temperature.

* * * * *